AUTOBALANCED DIODE BRIDGE SAMPLING GATE

Filed Aug. 23, 1971

3,721,829
AUTOBALANCED DIODE BRIDGE SAMPLING GATE

George Mead Benson, Matawan, N.J., assignor to Bell Telephone Laboratories, Incorporated, Murray Hill, N.J.

Filed Aug. 23, 1971, Ser. No. 173,826
Int. Cl. H03k *17/00*
U.S. Cl. 307—235 10 Claims

ABSTRACT OF THE DISCLOSURE

A diode bridge sampling gate includes a first feedback loop which automatically balances the gate drive current and thereby essentially eliminates any DC offset in the output. This first feedback loop comprises a dual output current source which supplies current to the control terminals and an operational amplifier which compares the gate bias voltages and uses the comparison to control the dual output current source in such a way as to balance these bias voltages. A second feedback loop may also be included, which maintains one of the gate bias currents at a constant value independent of nominal power supply variations. This reduces the sensitivity of the gate current balance to the tracking of the outputs of the dual current source.

BACKGROUND OF THE INVENTION

This invention relates to sampling gates, and more particularly, to autobalanced diode bridge sampling gates.

The diode bridge sampling gate is typically used in sample and hold, and resampler circuits which find a variety of uses in signal processing systems. These systems generally require that the gate operate at high switching speeds and in a very linear fashion. Therefore, the gate should have short rise and fall times. Additionally, it is desirable that this type of circuit have low power consumption, use low drive levels, and use low voltage power supplies. In order to accomplish these goals and to allow for use of integrated circuit fabrication techniques, transistor switches have generally been employed in this type circuit. However, these circuits usually do not maintain balance in the bridge drive currents very well and thus cause a DC offset (pedestal) in the output signal. One of the reasons for this lack of balance is the fact that the low level voltages required in integrated circuits make it difficult to design stable current sources for the gate.

Another type of gate imbalance occurs when an input signal is applied to the gate. This input signal will cause some of the gate current to flow into the signal source, producing an error voltage which could be significant if the signal source has a large internal resistance. This type of offset can be eliminated with elaborate feedback techniques; however, it is more simply eliminated by using a low impedance signal source.

An additional problem in sample and hold circuits using conventional sampling gates is the nonlinearity in the transfer function caused by the application of momentary charging current to the output capacitance during turn-off. This nonlinearity produces an error in the magnitude of the output voltage, with resultant spurious frequency components.

It is therefore an object of this invention to provide a diode bridge sampling gate which is extremely linear and capable of automatically maintaining a zero or preselected offset.

SUMMARY OF THE INVENTION

The present invention is directed to the reduction of the problems of linearity and output offset in a diode sampling gate through the use of a transistorized gate drive arrangement and feedback loops which balance the gate drive currents. This allows for the maintenance of linearity and a zero, or preselected, offset despite nominal changes in circuit parameters or supply voltages.

In an illustrative embodiment of the present invention, four diodes are connected in a conventional diode bridge sampling gate arrangement. This arrangement has an input, an output, and two control terminals. Each output of a dual output current source is connected to a separate control terminal. This establishes a bias voltage associated with each control terminal because a network, consisting of a diode in series with a resistor and capacitor in parallel, is connected between each control terminal and ground. Current from the dual output source flows through these RC networks whenever the gate is OFF, thereby generating the gate bias voltages.

The gate is switched by applying complementary pulses to the bases of an emitter-coupled transistor pair, which has each of its collectors connected to a separate gate control terminal. A second current source is connected between the emitters of the transistor pair and ground. An operational amplifier connected as a noninverting integrator compares the gate bias voltage across each RC network and adjusts the dual output current source until the bias voltages are equal. This makes the drive currents equal and assures that the DC offset due to unbalanced gate drive currents is essentially eliminated. The emitter-coupled transistor pair performs a current steering or routing function in the gate which causes even slow fall time drive pulses to produce uniform transition of all the quad diodes from ON to OFF; that is, the currents in the bridge diodes will be reduced together and the diodes themselves will turn OFF together. In prior art circuitry, depending on the input signal, the diodes did not turn OFF together and a momentary charging current was applied to the output during the gate turn-off time, causing an error in the output.

A second operational amplifier connected as an inverting integrator compares one of the bias voltages to a reference voltage and its output signal is used to adjust the second current source at the emitters of the transistor pair until the two voltages are equal. This removes the circuit's sensitivity to nominal variations in the supply voltage. When both operational amplifiers are functioning the circuit can be balanced to compensate for nonuniform characteristics in the transistors and diodes of the circuit by trimming one of the bias network resistances. Also, the circuit can be intentionally unbalanced in order to compensate for a DC offset in the input signal. Once the gate is trimmed for a particular set of parameters it will maintain its balance despite nominal changes in supply voltage.

The foregoing and other features of the present invention will be more readily apparent from the following detailed description and drawings.

DETAILED DEECRIPTION

Figure 1:
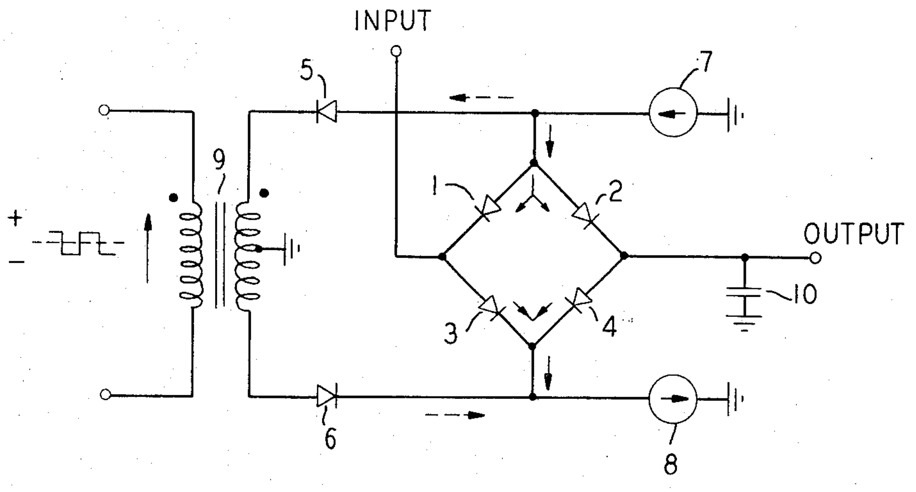
FIG. 1 PRIOR ART
FIG. 1 is a schematic of a prior art diode bridge sampling gate.

FIG. 1 is a schematic diagram of a prior art diode bridge sampling gate, commonly known as a Lewis gate. In this gate four diodes (1, 2, 3 and 4) are arranged so that the anodes of diodes 1 and 2 are connected together and the cathodes of diodes 3 and 4 are connected together. This arrangement is commonly known as a diode bridge or quad. The input to the gate is applied to the cathode of diode 1 and the anode of diode 3; while the output of the gate is taken from the cathode of diode 2 and the anode of diode 4. A positive current supply 7, is connected to the junction between diodes 1 and 2 and a negative current supply 8, is connected to the junction between diodes 3 and 4.

The anodes of a diode 5 is connected to the output of current supply 7 and its cathode is connected to the first output terminal of a transformer 9. In addition, the anode of a diode 6 is connected to the second output of transformer 9 and its cathode is connected to the output of current supply 8. The output of transformer 9 supplies voltage pulses to the diode quad and its input terminals are connected to a source of voltage pulses. Since this type of circuit is generally used in a sample and hold system; a capacitor 10, connected between the output of the circuit and ground, is included to represent the holding capacitor in such a system.

When there is a negative voltage pulse present at the input to transformer 9, the gate is OFF and the current flows as indicated by the dashed arrows. When a positive voltage pulse occurs, diodes 5 and 6 are turned OFF and current flows through the diode quad as indicated by the solid arrows. When this happens the gate is ON and the voltage level at the input is transferred to the output. This happens because all of the diodes of the quad are forward biased and the drops across diodes 1 and 3 are compensated by the drops across diodes 2 and 4. In some of the prior art circuits of this type, a transistor voltage drive circuit, such as a differential pair, is used instead of the transformer.

When the input voltage is substantially different from the voltage on the holding capacitor 10, and the gate is switched ON, the holding capacitor is charged or discharged to the input voltage by two distinct modes of gate operation. Initially, two non-adjacent bridge diodes begin conducting while the other two diodes remain reverse biased. Under these conditions the circuit operates in the constant current mode and one of the current generators (7 or 8) either charges or discharges capacitor 10. By way of example, if capacitor 10 is initially uncharged and the input is +2 volts, when the gate is switched ON diodes 2 and 3 will conduct and diodes 1 and 4 will not. Therefore, current supply 7 will charge capacitor 10 through diode 2. As the voltage across capacitor 10 approaches the input voltage, the two previously nonconducting diodes begin to conduct. When this occurs the current begins to divide between the four arms of the bridge. By the time the capacitor voltage is within $$2\left(\frac{mkT}{q}\right)$$

of the input voltage, all the diodes are fully conducting and the second or RC charging mode is initiated. In the previous expression $k$ is Boltzmann's constant, T is absolute temperature, $q$ is the electronic charge and $m$ is a constant which depends on the diodes used. The charging resistance in this mode will vary with time while the bridge is in the process of balancing until the difference between the input voltage and the capacitor voltage is less than $mkT/q$. At this point, the charging resistance is essentially constant and the charging circuit is pure RC except for some small inductance made up of parasitic inductance and the inductance of the driving circuit.

When the voltage output of the transformer is reversed to turn the gate OFF by a signal having a slow fall time, the capacitor will continue to charge in the RC mode, following the input, until one or the other of the coupling diodes (5 or 6) begins conducting. The one which will conduct first will depend on the polarity of the input signal. At this time the bridge diodes on that side will turn OFF; but the other half of the bridge will remain ON, either charging or discharging capacitor 10 with one of the current sources. This will continue until the transformer voltage has changed sufficiently to turn OFF the other diodes of the bridge. At that point the voltage on the capacitor will be held, but it will differ from the input at the time the signal to turn OFF was given by a small increment. This action of the gate can be better understood if a +2 volt input signal, a 6-foot transformer signal, and a 0.7 volt diode forward voltage are assumed. When the turn OFF signal occurs, the voltage at the capacitor will be +2 volts, the voltage at the top node of the bridge will be approximately +2.7 volts, and the voltage at the bottom node will be approximately +1.3 volts. For a complete transition the transformer will change the voltage at the cathode of diode 5 from +3 volts to −3 volts and the voltage at the anode of diode 6 from −3 volts to +3 volts. An examination of the condition of the gate at the point in the transition, where the transformer voltage has changed enough that the voltage at the cathode of diode 5 is +1 volt and the voltage at the anode of diode 6 is −1 volt, reveals the fact that diodes 3, 4, and 5 are conducting; but diodes 1, 2, and 6 are not. This causes the charge on capacitor 10 to be drawn off by current supply 8 through diode 4. Eventually, the transformer voltage reverses and diode 6 also conducts, thus causing all the quad diodes to turn OFF. Therefore, the amount of error voltage on the output is proportional to the switching time and the input voltage level in a nonlinear fashion, thereby causing distortion of the samples.

Figure 2:
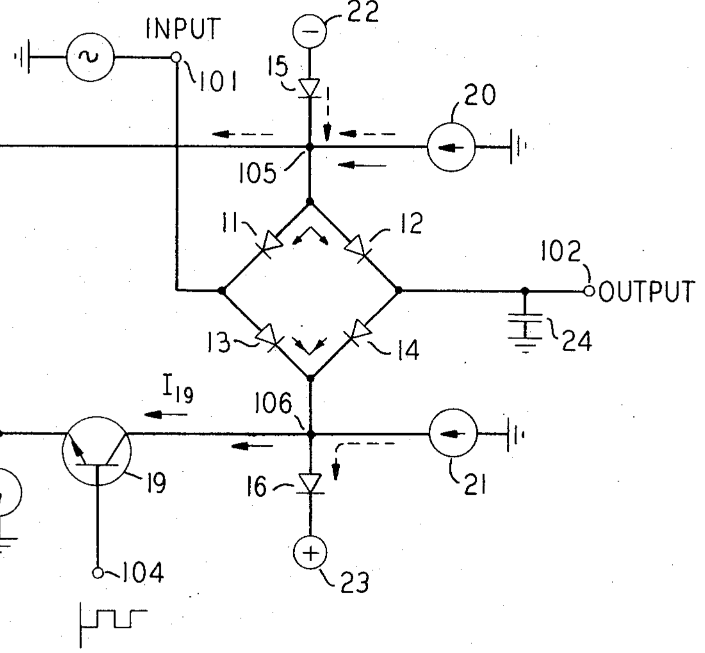
FIG. 2 is a schematic of an illustrative embodiment of the invention.

One way of reducing this error in the held voltage across the capacitor is to switch the gate very rapidly. However, FIG. 2 is a schematic diagram of a gate circuit which will overcome the nonlinearity of the circuit of FIG. 1, without the necessity for extremely fast switching. In the circuit of FIG. 2 a diode quad is arranged so that the anode of diode 11 and the anode of diode 12 are connected to gate control terminal 105. Also, the cathode of diode 13 and the cathode of diode 14 are connected to control terminal 106. The circuit input signal at terminal 101 is applied to the cathode of diode 11 and the anode of diode 13; while the circuit output at terminal 102 is taken from the cathode of diode 12 and the anode of diode 14. A diode 15 has its cathode connected to control terminal 105 and its anode connected to a negative voltage source 22. In addition, a diode 16 has its anode connected to control terminal 106 and its cathode connected to positive voltage source 23. These diodes and voltage sources provide bias at the control terminals of the quad. Positive current sources 20 and 21 supply current to control terminals 105 and 106, respectively. It should be noted that current source 21 conducts in the opposite direction from current source 8 of FIG. 1. These current sources supply the gate drive current for the circuit.

The collectors of a complementarily driven emitter-coupled transistor pair, which acts to switch the gate, are connected to control terminals 105 and 106. Transistor 18 of the transistor pair has its collector connected to control terminal 105, its base connected to a source of voltage pulses at terminal 103 and its emitter connected to negative current source 17. Transistor 19 of the transistor pair has its collector connected to control terminal 106, its base connected to a source of voltage pulses at terminal 104 and its emitter connected to the output of negative current source 17. This transistor pair performs current mode switching of the gate.

This circuit arrangement, like that of FIG. 1, is also useful as a sample and hold circuit. Consequently capacitor 24, connected between output terminal 102 and ground, is included to represent the holding capacitor of such a circuit.

Transistors 18 and 19 are complementarily driven by sources 103 and 104 so that when one is ON the other is OFF. When transistor 18 is ON, the gate is OFF and the current is as shown by the dashed arrows. These currents develop bias voltages at terminals 105 and 106 which prevent the bridge diodes from conducting. However, when transistor 19 is ON and transistor 18 is OFF, the current flow is as indicated by the solid arrows. In this case all of the diodes of the bridge are forward biased and the signal at input 101 is transferred to the output 102. This type of circuit has the dual charging modes discussed in relation with FIG. 1. However, it does not suffer from the error current which occurs during the turn OFF of a Lewis gate. When there is a voltage level at the input and the current routing pair is switched with a signal that has a slow rise time, the current through the bridge will uniformly decrease as the current $I_{18}$ through transistor 18 uniformly increases. Also, the current $I_{19}$ through transistor 19 will uniformly decrease. Therefore, all the diodes of the bridge will turn OFF together and no extra charge will be applied to or drawn from the holding capacitor just before the bridge opens. Since this error current is no longer present, the gate has a substantially linear transfer function. Also, the need for extremely fast switching at the control terminals is eliminated. However, this circuit has one additional current source and all three of the current sources must be in the proper ratio to each other in order to avoid excessive DC offset at the output. To accomplish this, regulating feedback loops are included in the basic system to insure current balance.

Figure 3:
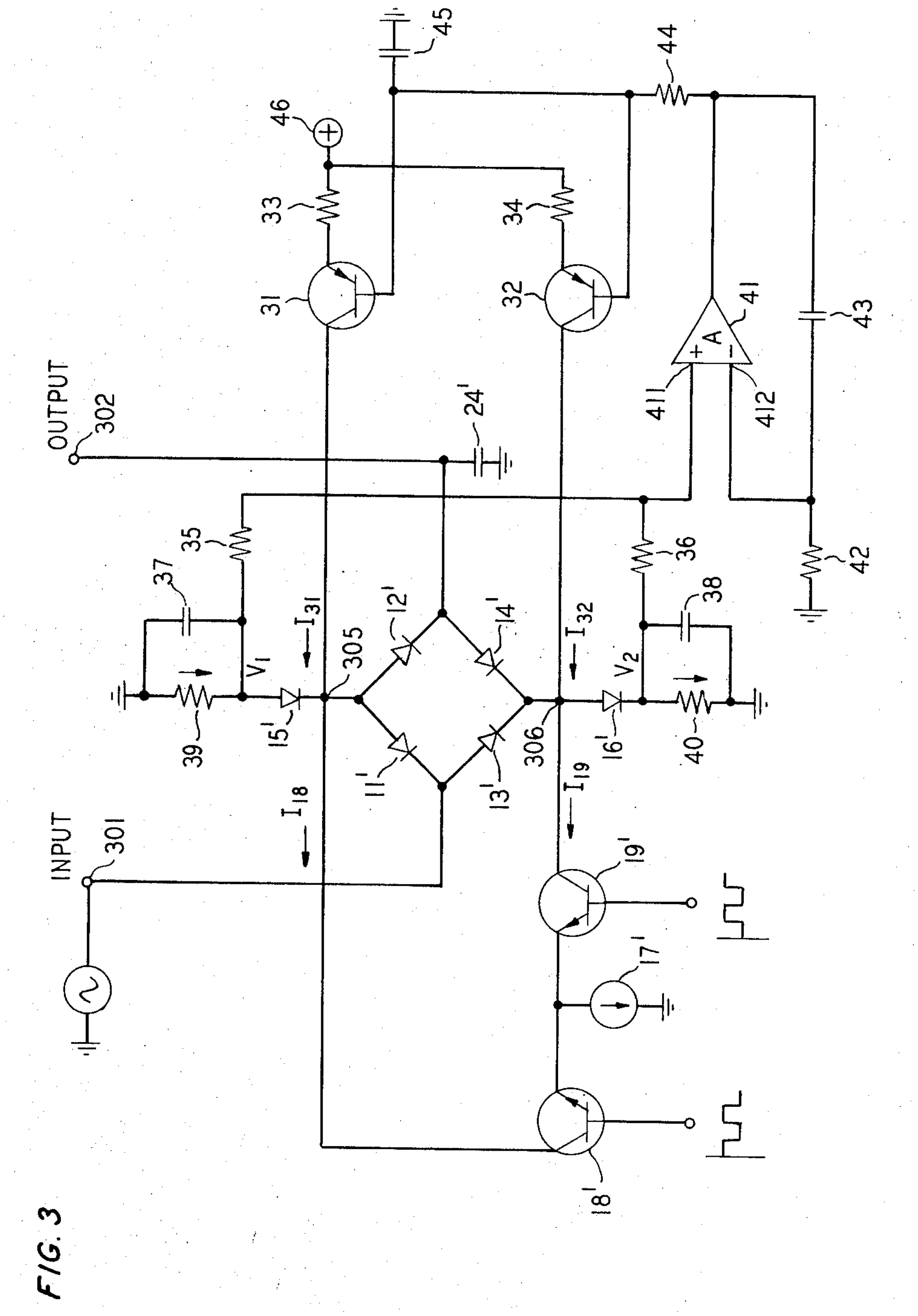
FIG. 3 is a schematic of an illustrative embodiment of the invention with autobalanced gate drive currents.

FIG. 3 is an illustrative embodiment of the invention with a feedback loop to balance the gate drive current. The arrangement is similar to that of FIG. 2 and corresponding parts have the same numerical designations but are marked with a prime. The current sources 20 and 21 of FIG. 2 have been replaced with a dual output transistor current source comprising amplifier 41, transistor 31 and transistor 32. In this dual output current source resistor 33 is connected between a positive voltage source 46 and the emitter of transistor 31. Similarly, resistor 34 is connected between the same positive voltage source 46 and the emitter of transistor 32. The collectors of transistors 31 and 32, which are the outputs of the current source, are connected to the gate control terminals 305 and 306, respectively.

The voltage source 22 of FIG. 2 has been replaced with a network comprising resistor 39, in parallel with capacitor 37, connected between the anode of diode 15' and ground. Also, voltage source 23 of FIG. 2 has been replaced with resistor 40 and capacitor 38 connected in parallel between the cathode of diode 16' and ground. Whenever the gate is OFF, the current through resistor 39 is equal to $I_{18}-I_{31}$ and the current through resistor 40 is equal to $I_{32}$. If a fifty percent duty cycle for the gate is assumed, and also a very large value for capacitor 37, then the voltage developed across resistor 39 will be $$V_1=-\tfrac{1}{2}(I_{18}-I_{31})R_{39} \qquad (1)$$

and the voltage across resistor 40 will be $$V_2=\tfrac{1}{2}I_{32}R_{40} \qquad (2)$$

where $I_{18}$, $I_{31}$, and $I_{32}$ are the collector currents of transistors 18, 31, and 32, respectively, and $R_{39}$ and $R_{40}$ are the resistances in ohms of resistors 39 and 40, respectively.

The voltage across resistor 39 is applied through resistor 35 to input 411 of operational amplifier 41 and the voltage across resistor 40 is applied through resistor 36 to the same input, 411, of operational amplifier 41. A resistor 42 is connected between input 412 of amplifier 41 and ground. Also, a capacitor 43 is connected between the output of amplifier 41 and input 412. This causes the amplifier to perform as a noninverting integrator. The output signal of amplifier 41 is applied to the bases of transistors 31 and 32 through a resistor 44 and acts to control the collector current of these transistors. A capacitor 45, which acts as a filter, is connected between the junction of the bases of transistors 31 and 32, and ground. The voltages across resistors 39 and 40 are compared by the amplifier and the output is used to control the currents from transistors 31 and 32. This arrangement assures that the voltages $-V_1$ across resistor 39 and $V_2$ across resistor 40 are equal. When voltage $V_2$ is less than $-V_1$, the voltage at input 411 of amplifier 41 is negative. This produces a negative voltage change on the bases of transistors 31 and 32 which causes their current outputs to increase. This increase in current output causes the voltage $V_2$ to increase and the voltage $-V_1$ to decrease, thus balancing the circuit. Therefore, with the voltages across resistors 39 and 40 equal, $$(I_{18}-I_{31})R_{39}=I_{32}R_{40} \qquad (3)$$

Under ideal circumstances $I_{31}=I_{32}$ and $I_{18}=I_{19}$. These conditions will be true when the transistors of the dual current source and the emitter-coupled pair are perfectly matched. Then, if $R_{39}=R_{40}$ and all of the quad diodes are matched, the output offset (pedestal) will be zero for a zero input offset. This can be seen by the fact that the current into the top node, 305, of the diode bridge when the gate is ON is $$I_{in}=I_{31}=I_{18}/2 \qquad (4)$$

and the current out of the bottom node, 306, is $$I_{out}=I_{19}-I_{32}=(I_{19}-I_{19}/2)=I_{19}/2=I_{18}/2 \qquad (5)$$

where $I_{19}$ is the collector current of transistor 19. This shows that the gate drive currents are automatically balanced when the transistors are matched and $R_{39}=R_{40}$.

If there is a mismatch in the $V_{be}$ or $\beta$ of transistors 31 and 32, then $$I_{31}=I_{32}+\Delta I_1 \qquad (6)$$

where $\Delta I_1$ is the difference between $I_{31}$ and $I_{32}$. With the use of Equation 6, Equation 3 can be solved for $$I_{32}=\frac{I_{18}-\Delta I_1}{2} \qquad (7)$$

$$I_{in}=I_{31}=\frac{I_{18}+\Delta I_1}{2} \qquad (8)$$

and $$I_{out}=I_{19}-I_{32}=\frac{I_{18}+\Delta I_1}{2} \qquad (9)$$

These equations show that the drive current balance is maintained; but, the value of the gate current changes by $\Delta I_1/2$. If there is also a mismatch in the characteristics of $T_{18}$ and $T_{19}$, their current relationship can be represented by $$I_{18}=I_{19}+\Delta I_2 \qquad (10)$$

where $\Delta I_2$ is the difference between $I_{18}$ and $I_{19}$. Substitution of Equations 6 and 10 into Equation 3, yields $$[(I_{19}+\Delta I_2)-(I_{32}+\Delta I_1]R_{39}=(I_{32})R_{40} \qquad (11)$$

which can be solved for $$I_{19}=\left(\frac{R_{40}}{R_{39}}+1\right)I_{32}+\Delta I_1-\Delta I_2 \qquad (12)$$

or $$I_{32}=\frac{I_{19}+\Delta I_2-\Delta I_1}{\left(1+\frac{R_{40}}{R_{39}}\right)} \qquad (13)$$

The current into the top node of the quad, as previously stated, is $I_{in}=I_{32}+\Delta I_1$, and the current out of the bottom node is $I_{out}=I_{19}-I_{32}$. If these two terms are equal the gate will again be balanced. As Equation 12 indicates, this will occur if one of the resistors is changed so that $$\frac{R_{40}}{R_{39}}=1+\frac{\Delta I_2}{I_{32}} \qquad (14)$$

If Equation 13 is substituted into Equation 14

$$\frac{R_{40}}{R_{39}}=\frac{I_{19}-\Delta I_1+2\Delta I_2}{I_{19}-\Delta I_1} \quad (15)$$

This shows that the balance condition is dependent on $\Delta I_1$ and $\Delta I_2$. Thus, it has been shown that a mismatch in transistors 31 and 32 is compensated automatically, while a mismatch in transistors 18' and 19' requires an adjustment in the bias resistors in order to balance the gate drive currents. However, adjusting those resistors causes the circuit to become sensitive to the match of transistors 31 and 32, $\Delta I_1$. Equation 14 shows that this latter sensitivity can be removed by fixing the current $I_{32}$ at a constant value.

Figure 4:
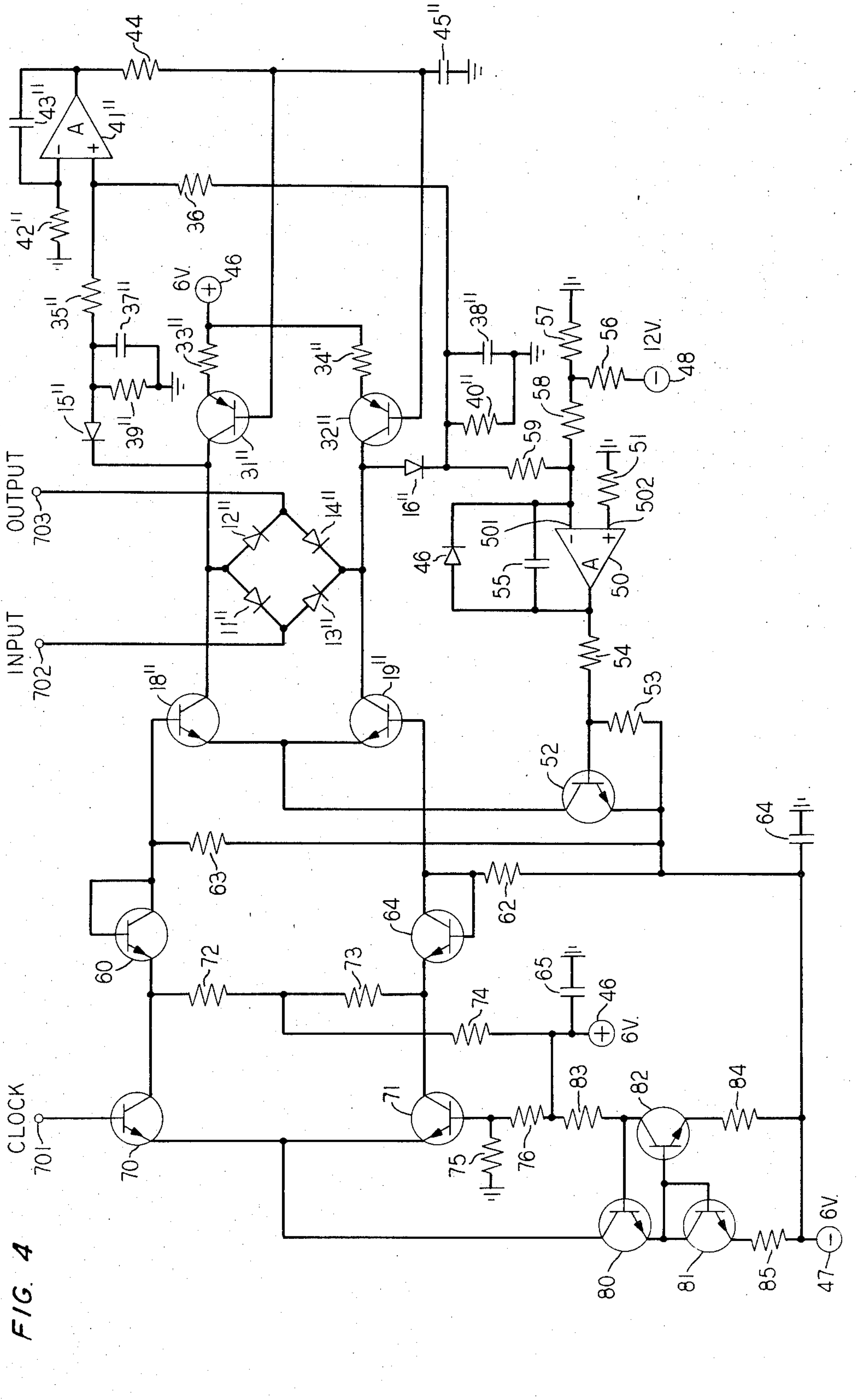
FIG. 4 is a schematic of an illustrative embodiment of the invention with autobalanced gate drive currents which are insensitive to current supply tracking.

FIG. 4 is an illustrative embodiment of the invention with a second feedback loop to keep the current $I_{32}$ at a constant value. The arrangement of FIG. 4 is similar to that of FIG. 3 and corresponding parts have the same numerical designation but are marked with a double prime. The current source 17' of FIG. 3 has been replaced with transistor 52 in FIG. 4. The collector of transistor 52 is connected to the junction of the emitters of transistors 18'' and 19'', and the emitter of transistor 52 is connected to a negative voltage source 47. The voltage at the base of transistor 52 controls the amount of collector current which will flow and thus causes transistor 52 to act like a current source. The base voltage for controlling this current source is applied through resistor 54, which is connected between the output of amplifier 50 and the base of transistor 52. Also, a resistor 53 is connected between the base of transistor 52 and its emitter. The control voltage for this current source is generated by comparing one of the bias voltages against a reference voltage. To accomplish this a resistor 51 is connected between input terminal 502 of amplifier 50 and ground, and the voltage across bias resistor 40'' is applied to input terminal 501 of amplifier 50 through resistor 59. Input 501 is also connected to ground through resistors 58 and 57, which are connected in series. The junction of resistors 58 and 57 is connected to a negative voltage supply 48 through resistor 56, thereby generating the reference voltage.

A capacitor 55, connected between input terminal 501 of amplifier 50 and its output, causes the amplifier to function like an integrator. In addition, a feedback diode, 46, has its anode connected to the output of the amplifier and its cathode connected to the inverting input 501. This diode prevents the circuit from locking up during turn-on. Since the voltage across bias resistor 40'' is related to the current $I_{32}$ and the gate duty cycle, the current through resistor 59 to amplifier 50 is proportional to the current $I_{32}$. This current is compared with a reference current through resistor 58 which is derived from the negative voltage source 48 and resistors 56 and 57. The output of amplifier 50 is, therefore, proportional to the comparison between this reference current and the current proportional to $I_{32}$, and controls the current which is drawn by transistor 52 from the emitters of transistors 18'' and 19''. Any change in the current $I_{32}$ will be detected by amplifier 50 and will cause a corresponding change in the current of transistor 52 which will re-establish the current $I_{32}$ at its previous value. The value of $I_{32}$ will be determined by the relationship between resistors 56, 57, 58, and 59. Equation 12 shows that the second feedback loop eliminates the sensitivity of the gate current balance to the tracking of current source transistors 31 and 32 even when the ratio of $R_{39}$ and $R_{40}$ is not unity.

The complementary drive voltage for transistors 18'' and 19'' is derived from a clock signal applied to terminal 701 of FIG. 4. Terminal 701 is also connected to the base of transistor 70, which is part of the circuitry for developing the complementary drive voltages. Transistor 70 and transistor 71 are connected in a current routing arrangement with their emitters connected together. A resistor 75 is connected between the base of transistor 71 and ground; while a resistor 76 is connected between positive voltage source 46 and the base of transistor 71. The collectors of transistors 70 and 71 are connected together through resistors 72 and 73, which are in series. The junction of resistors 72 and 73 is connected to the positive voltage source 46, through resistor 74. The collector signals of transistors 70 and 71 are coupled to the bases of transistors 18'' and 19'' through transistors 60 and 64, respectively. Transistors 60 and 64 are connected to act as Zener diodes. Their emitters are connected to the collectors of transistors 70 and 71 and their collectors are connected to the bases of transistors 18'' and 19''. The bases of transistors 60 and 64 are connected to their collectors. A resistor 62 is connected between the collector of transistor 64 and negative voltage source 47. Also, a resistor 63 is connected between the collector of transistor 60 and the same negative voltage source, 47. These resistors (62 and 63) act as sinks for the Zener currents of transistors 60 and 64.

A constant current source, comprising transistors 80, 81 and 82, is connected to the emitters of transistors 70 and 71. These transistors are arranged so that the collector of transistor 80 is connected to the junction of the emitters of transistors 70 and 71. Also, the emitter of transistor 80 is connected to the collector of transistor 81, the base of transistor 81, and the base of transistor 82. A resistor 85 is connected between negative voltage source 47 and the emitter of transistor 81. The emitter of transistor 82 is connected to negative voltage source 47 through a resistor 84, and its collector is connected to transistor 60 and the same negative voltage source 47. the base of transistor 80. In addition, a resistor 83 is connected between positive voltage source 46 and the collector of transistor 82. In order to prevent power supply noise from getting to the bases of the gate drive transistors, 18'' and 19'', a capacitor 64 is connected between the negative voltage supply 47 and ground.

In the previous discussion it was understood that balanced gate drive currents were desired; that is, the current into the top node of the quad should equal the current out of the bottom node. This is true when the four diode quads have identical forward characteristics and the input offset voltage is zero. Under these conditions a balanced current drive produces equal diode currents and zero output pedestals. It was also shown that to achieve balance when there is a mismatch in the gate drive transistors 18'' and 19'', resistors 39'' and 40'' must be trimmed. However, if the four diodes making up the quad have different forward characteristics, or if the input to the gate is DC offset, an unbalanced gate drive is required to achieve a zero output pedestal. The amount of unbalance required depends on the forward characteristics of the particular diodes used and on the DC offset that must be canceled. Therefore, trimming the bias voltage resistors will allow for compensation for mismatch in the various active components of the gate and will also allow for the compensation of a DC offset in the input signal. Cancellation of the DC offset is particularly important in integrated circuit signal processing systems since it allows for the elimination of bulky blocking capacitors.

While the invention has been particularly shown and described with reference to preferred embodiments thereof, it will be understood by those skilled in the art that various changes in form and detail may be made therein without departing from the spirit and scope of the invention.

What is claimed is:

1. A diode bridge sampling gate circuit having an input and an output, comprising:
   - a diode quad having an input terminal connected to the circuit input, an output terminal connected to the circuit output, a first control terminal, and a second control terminal;

a first positive current source connected to the first control terminal of said diode quad;

a second positive current source connected to the second control terminal of said diode quad;

a first diode having its cathode connected to the first control terminal of said diode quad;

a second diode having its anode connected to the second control terminal of said diode quad;

a first biasing means connected to the anode of said first diode for producing a negative voltage at the anode of said first diode;

a second biasing means connected to the cathode of said second diode for producing a positive voltage at the cathode of said second diode; and a dual output constant current switching means having its first output connected to the first control terminal and its second output connected to the second control terminal of said diode quad for alternately drawing a constant current from the first and second control terminals of said diode quad.

2. A circuit as claimed in claim 1 wherein said diode quad comprises:

a first diode having its anode connected to the first control terminal of said diode quad and its cathode connected to the input terminal;

a second diode having its anode connected to the first control terminal of said diode quad and its cathode connected to the output terminal;

a third diode having its anode connected to the input terminal of said diode quad and its cathode connected to the second control terminal; and a fourth diode having its anode connected to the output terminal of said diode quad and its cathode connected to the second control terminal.

3. A circuit as claimed in claim 1 wherein said dual output switching means comprises:

a first transistor having its collector connected to the first output of said switching means;

a second transistor having its collector connected to the second output of said switching means and its emitter connected to the emitter of said first transistor;

a negative current source connected to the emitter of said first transistor; and means for generating a first and second complementary voltage signal in response to an input timing signal, the first complementary signal being applied to the base of said first transistor and the second complementary signal being applied to the base of said second transistor.

4. A diode bridge sampling gate circuit having an input and an output comprising:

a diode quad having an input terminal connected to the circuit input, an output terminal connected to the circuit output, a first control terminal, and a second control terminal;

a dual output positive current source having a first output connected to the first control terminal of said diode quad, a second output connected to the second control terminal of said diode quad, and a control terminal;

a first diode having its cathode connected to the first control terminal of said diode quad;

a second diode having its anode connected to the second control terminal of said diode quad;

a first biasing network connected between the anode of said first diode and ground, comprising a first resistor and a first capacitor connected in parallel;

a second biasing network connected between the cathode of said second diode and ground, comprising a second resistor and a second capacitor connected in parallel;

a voltage comparison means for comparing the voltages across said first and second biasing networks and producing an output signal in response to the comparison which is applied to the control terminal of said dual output current source, the output signal of said voltage comparison means controlling the dual output current source in such a way as to make the voltage across said first and second biasing networks substantially equal in magnitude;

a first transistor having its collector connected to the first control terminal of said diode quad;

a second transistor having its collector connected to the second control terminal of said diode quad and its emitter connected to the emitter of said first transistor;

a single output negative current source having an output and a control terminal, the output of said negative current source being connected to the emitter of said first transistor;

means for generating a control voltage at the control terminal of said single output negative current source; and means for generating first and second complementary voltage signal outputs from an input timing signal, the first complementary signal output being applied to the base of said first transistor and the second complementary signal output being applied to the base of said second transistor.

5. A circuit as claimed in claim 4 wherein said dual output positive current source comprises:

a first current source transistor having its collector connected to the first output of said dual output current source;

a second current source transistor having its collector connected to the second output of said dual output current source and its base connected to the base of said first current source transistor;

a first voltage source;

a first current source resistor connected between the emitter of said first current source transistor and the first voltage source;

a second current source resistor connected between the emitter of said second current source transistor and the first voltage source;

a third current source resistor connected between the base of said first current source transistor and the control terminal of said dual output current source; and a current source capacitor connected between the base of said first current source transistor and ground.

6. A circuit as claimed in claim 4 wherein said voltage comparison means comprises:

a first operational amplifier having an inverting input, a noninverting input and an output, the output of said first operational amplifier being connected to the control terminal of said dual output positive current source;

a first comparison resistor connected between the anode of said first diode and the noninverting input of said first operational amplifier;

a second comparison resistor connected between the cathode of said second diode and the noninverting input of said first operational amplifier;

a third comparison resistor connected between the inverting input of said first operational amplifier and ground; and a first comparison capacitor connected between the inverting input and the output of said first operational amplifier.

7. A circuit as claimed in claim 4 wherein said single output negative current source comprises:

a second voltage source;

a transistor having its collector connected to the output of said single output negative current source, its base connected to the control terminal of said single output current source, and its emitter connected to the second voltage source; and a resistor connected between the base and emitter of said transistor.

8. A circuit as claimed in claim 4 wherein said means for generating a first and second complementary voltage signal outputs comprises:

a first generator transistor having its base connected to the input timing signal;

a second generator transistor having its emitter connected to the emitter of said first generator transistor;

a third generator transistor having its emitter connected to the collector of said first generator transistor, its collector connected to said first complementary voltage signal output, and its base connected to its collector;

a fourth generator transistor having its emitter connected to the collector of said second generator transistor, its collector connected to said second complementary voltage signal output, and its base connected to its collector;

first and second generator resistors connected in series between the collectors of said first and second generator transistors;

third and fourth voltage sources;

a third generator resistor connected between the junction of said first and second generator resistors and said third voltage source;

a fourth generator resistor connected between the base of said second generator transistor and ground;

a fifth generator resistor connected between the base of said second generator transistor and said third voltage source;

a sixth generator resistor connected between the collector of said third generator transistor and said fourth voltage source;

a seventh generator resistor connected between the collector of said fourth generator transistor and said fourth voltage source;

a fifth generator transistor having its collector connected to the emitter of said first generator transistor;

a sixth generator transistor having its collector connected to its base and to the emitter of said fifth generator transistor;

a seventh generator transistor having its base connected to the collector of said sixth generator transistor and its collector connected to the base of said fifth generator transistor;

an eighth generator resistor connected between the emitter of said sixth generator transistor and said fourth voltage source;

a ninth generator resistor connected between the emitter of said seventh generator transistor and said fourth voltage source; and a tenth generator resistor connected between the collector of said seventh generator transistor and said third voltage source.

9. A circuit as claimed in claim 4 wherein said means for generating a control voltage for said single output negative current source operates in such a manner as to keep the current in the collector of said second current source transistor of said dual output positive current source substantially constant.

10. A circuit as claimed in claim 9 wherein said means for generating a control voltage for said single output current source comprises:

a second operational amplifier having an inverting and noninverting input;

a first controller resistor connected between the cathode of said second diode and the inverting input of said second operational amplifier;

a second controller resistor connected between the noninverting input of said second operational amplifier and ground;

third and fourth controller resistors connected in series between the inverting input of said second operational amplifier and ground;

a fifth voltage source;

a fifth controller resistor connected between said fifth voltage source and the junction of said third and fourth controller resistors;

a first controller capacitor connected between the inverting input and the output of said second operational amplifier;

a sixth controller resistor connected between the output of said second operational amplifier and the control terminal of said single output negative current source; and a feedback diode having its anode connected to the output of said second operational amplifier and its cathode connected to the inverting input of said second operational amplifier.

References Cited

UNITED STATES PATENTS 3,449,596 6/1969 Milberger et al. ------ 307—257

HERMAN K. SAALBACH, Primary Examiner

B. P. DAVIS, Assistant Examiner

U.S. Cl. X.R.

307—257; 328—151